US006396197B1

(12) United States Patent
Szilagyi et al.

(10) Patent No.: US 6,396,197 B1
(45) Date of Patent: *May 28, 2002

(54) PIEZOELECTRIC SPEAKER

(75) Inventors: Andrei Szilagyi, Rancho Palos Verdes; Michael Strugach, Calabasas, both of CA (US)

(73) Assignee: Speaker Acquisition Sub, A Cayman Island Corporation, Grand Cayman (KY)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,394

(22) Filed: Apr. 6, 1998

Related U.S. Application Data

(63) Continuation-in-part of application No. 08/577,279, filed on Dec. 22, 1995, now Pat. No. 5,736,808.

(51) Int. Cl.[7] .......... H01L 41/08
(52) U.S. Cl. .......... 310/330; 310/328
(58) Field of Search .......... 310/322, 328, 310/330, 331, 334, 348

(56) References Cited

U.S. PATENT DOCUMENTS

| | | | | | |
|---|---|---|---|---|---|
| 1,526,319 | A | | 2/1925 | Chubb | 310/328 |
| 2,386,279 | A | * | 10/1945 | Tibbetts | 310/328 |
| 2,487,962 | A | * | 11/1949 | Arndt | 310/328 |
| 3,109,111 | A | | 10/1963 | Wiggins | 310/8.2 |
| 3,268,855 | A | | 8/1966 | Hagey | 340/315 |
| 3,278,695 | A | | 10/1966 | Craig | 179/110 |
| 3,560,771 | A | | 2/1971 | Baker | 310/328 |
| 4,045,695 | A | | 8/1977 | Itagaki | 310/322 |
| 4,283,605 | A | | 8/1981 | Nakajima | 179/110 A |
| 4,352,961 | A | | 10/1982 | Kumada et al. | 179/110 |
| 4,379,211 | A | | 4/1983 | Joscelyn, et al. | 179/110 A |
| 4,607,186 | A | | 8/1986 | Takayama, et al. | 310/330 |
| 4,654,554 | A | * | 3/1987 | Kishi | 310/345 |
| 4,696,045 | A | | 9/1987 | Rosenthal | 381/114 |
| 4,969,197 | A | | 11/1990 | Takaya | 381/190 |
| 5,514,927 | A | * | 5/1996 | Tichy | 310/330 |
| 5,541,467 | A | | 7/1996 | Kaida, et al. | 316/321 |
| 5,736,808 | A | * | 4/1998 | Szilagyi et al. | 310/322 |
| 5,804,906 | A | * | 9/1998 | Tsutsumi | 310/322 |

FOREIGN PATENT DOCUMENTS

| | | | | |
|---|---|---|---|---|
| JP | 56-106497 | * | 8/1981 | 310/328 |
| JP | 58-24299 | * | 2/1983 | 310/328 |
| JP | 58-105698 | * | 6/1983 | 310/328 |
| JP | 58-105699 | * | 6/1983 | 310/328 |
| JP | 61-61600 | * | 3/1986 | 310/328 |
| JP | 63-203941 | * | 8/1988 | 310/328 |
| JP | 63-263900 | * | 10/1988 | 310/328 |
| JP | 1-130699 | * | 5/1989 | 310/328 |
| JP | 2-7698 | * | 1/1990 | 310/328 |
| JP | 9-93696 | * | 4/1997 | 310/328 |
| JP | 2001-36992 | * | 2/2001 | 310/328 |

* cited by examiner

*Primary Examiner*—Thomas M. Dougherty
(74) *Attorney, Agent, or Firm*—Blakely, Sokoloff, Taylor & Zafman LLP

(57) ABSTRACT

A piezoelectric speaker is disclosed, comprising an elastic base, a piezoelectric material bender, and an acoustical linkage mounted to both the elastic base and the bender and serving to interconnect the elastic base and the bender. The acoustical linkage is fabricated from a rigid material and is mounted to the bender at approximately the geometric center of the bender. The bender may also be encapsulated by a case. The elastic base may include a computer keyboard, a bicycle helmet, a pen, a desk, a computer monitor or any other similar structure.

14 Claims, 16 Drawing Sheets

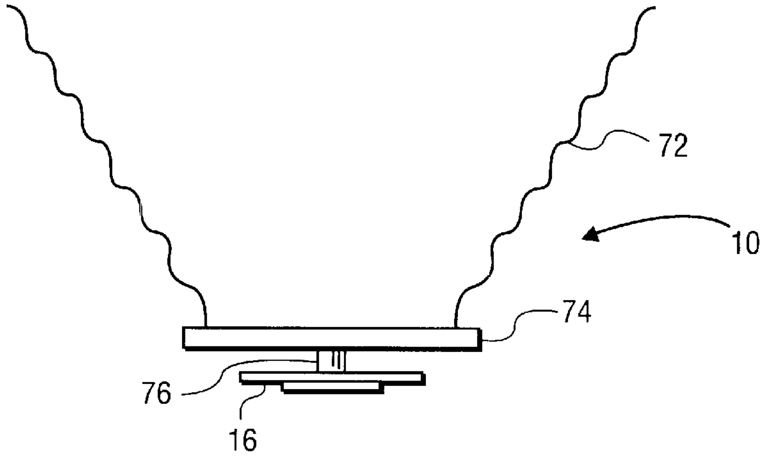
FIG. 10
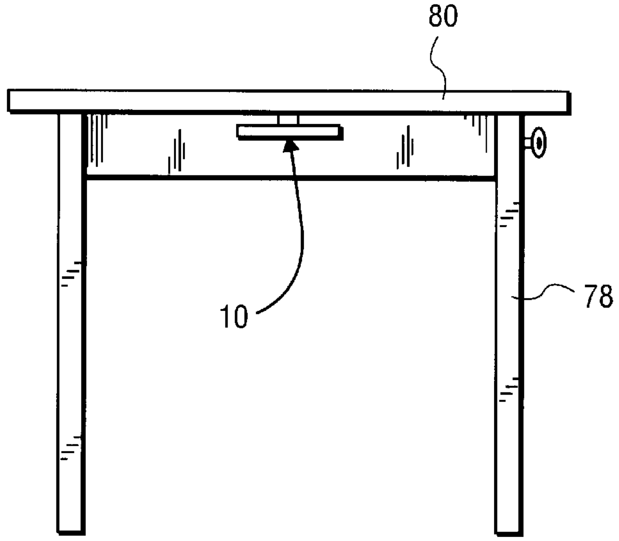
FIG. 11
FIG. 19
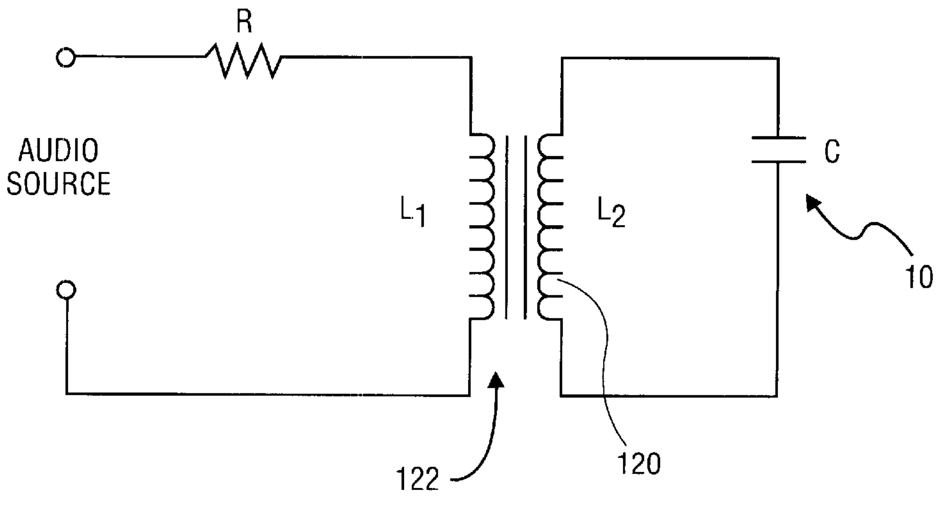

PIEZOELECTRIC SPEAKER

RELATED APPLICATION DATA

The present invention is a continuation-in-part of application Serial No. 08/577,279 filed Dec. 22, 1995 and now U.S. Pat. No. 5,736,808.

FIELD OF THE INVENTION

The present invention relates generally to a loudspeaker, and more particularly to a loudspeaker that generates sound using piezoelectric material.

BACKGROUND OF THE INVENTION

The present invention relates to a loudspeaker using piezoelectric or electroactive materials. Such materials, as is well known in the art, have the desirable property of converting electrical energy into mechanical energy, by undergoing a controllable amount of deformation when subjected to an applied electric field. Examples of electroactive materials include, among others, piezoelectric ceramics such as the lead zirconate titanate family (commonly known as PZT) with all its variously substituted and doped relatives, electrostrictive ceramics such as certain compositions of lanthanum doped PZT (PLZT) or lead magnesium niobate (PMN), and piezoelectric polymers such as polyvinylidene fluoride (PVDF).

In the speakers, the piezoelectric or electroactive material may be arranged in a variety of ways, including unimorph or bimorph benders. Benders are devices wherein the controlled strain of one or more layers is resisted by other layer or layers, resulting in a bending deformation. The most common benders are classified as unimorphs, which contain one active layer, and bimorphs, which contain two active layers. More recently another type of bender was introduced under the name of RAINBOW® (Reduced and Internally Biased Oxide Wafer) and possessing certain attractive performance characteristics. The RAINBOW® wafer is described in detail in U.S. Pat. No. 5,589,725, entitled "Monolithic Prestressed Ceramic Devices And Method For Making Same," which is incorporated by reference herein.

One of the uses of piezoelectric material known in the art is in loudspeaker applications. For example, Kumada et al., U.S. Pat. No. 4,352,961, discloses a flat panel speaker comprising a transparent resonator plate and a plate of a piezoelectric material held between a pair of electrodes. The piezoelectric material plate excites the resonator causing it to emit sound. Kumada requires the resonator plate and the piezoelectric material plate to be transparent, thus limiting the types of material that can be utilized as speakers. Furthermore, Kumada requires attachment at the edges of the resonator plate, which decreases the sound quality of the speaker.

In Takaya, U.S. Pat. No. 4,969,197, a piezoelectric speaker is disclosed that creates an acoustic pressure in air by piozoolpetrically driving a diaphragm. The diaphragm is an assembly of two resin foam plates facing each other. Each resin foam plate has a recess and a projecting member at the center of the recess bottom. The piezoelectric driver is accommodated in the space made of the two recesses while being interposed and supported by the projecting members. One of the disadvantages of Takaya is that it does not teach the best configuration choice for projecting members. Another disadvantage is that Takaya does not teach the best bender shape for optimizing sound quality.

The present invention avoids the problem of the known piezoelectric speakers by utilizing the favorable acoustic properties of various elastic bases. Unlike Kumada, the present invention is not limited to transparent material. By way of example, the elastic base may include a computer monitor housing, a television set, any welded structure such as an automobile cargo bay or file cabinet, a plastic box, a dry wall or building frame, a small appliance, or a bicycle helmet. In all these applications an acoustical pressure with higher dB level is generated by a significantly larger area of a driven object. In this manner, an entire structure becomes a speaker with numerous acoustical properties dependent upon the material and shape of the attached elastic base.

The feature of the present invention of utilizing an attached elastic base for acoustical output allows speakers to be conveniently designed in a very low profile, planar shape confined to fit even highly enclosure volumes. By way of example, the piezoelectric speaker can fit within a slot, such as in the case of a bicycle helmet application, or the piezoelectric speaker can fit within a thin layer space of approximately 0.040" in a computer keyboard application.

The present invention also provides sound quality superior to that of the prior art. The limitation of the Takaya device is overcome by using a rigid acoustical linkage that will not interfere with the transmission of vibrations. Furthermore, unlike Kumada, the present device does not require attachment at the edges. The attachment of the acoustical linkage at a single point, as disclosed herein, allows the acoustical properties of the speaker to be adjusted by varying the peripheral radii of curvature.

SUMMARY OF THE INVENTION

Accordingly, it is a primary object of the present invention to overcome one or more disadvantages and limitations of the prior art. A significant object of the present invention is to provide a piezoelectric speaker that is easily and inexpensively manufactured. It is another object of the present invention to provide a piezoelectric speaker that is easily secured to an existing structure.

According to a broad aspect of the present invention, the speaker includes an elastic base, a piezoelectric material bender, and an acoustical linkage mounted to both the elastic base and the bender and serving to interconnect the elastic base and the bender. The acoustical linkage is a fabricated from a rigid material and is mounted to the bender near the geometric center or any other acoustically favorable position on the bender. If needed, the bender may be encapsulated in a case. The elastic base may include a computer keyboard, a bicycle helmet or any other acoustically favorable elastic base.

A feature of the present invention is that the piezoelectric speaker is easily manufactured.

Another feature of the present invention is that the piezoelectric speaker has a broad frequency range.

Another feature of the present invention is that the piezoelectric speaker is easily adapted to existing structures.

These and other objects, advantages and features of the present invention will become readily apparent to those skilled in the art from a study of the following description of an exemplary preferred embodiment when read in conjunction with the attached drawing and appended claims.

BRIEF DESCRIPTION OF THE DRAWING

FIG. 10 is a side view of the piezoelectric speaker of the present invention in a conventional speaker application;

FIG. 11 is a front view of the piezoelectric speaker of the present inventing in a desk application;

FIG. 19 is a schematic of the transformer circuit driving the piezoelectric speaker of the present invention;

DESCRIPTION OF AN EXEMPLARY PREFERRED EMBODIMENT

Figure 1:
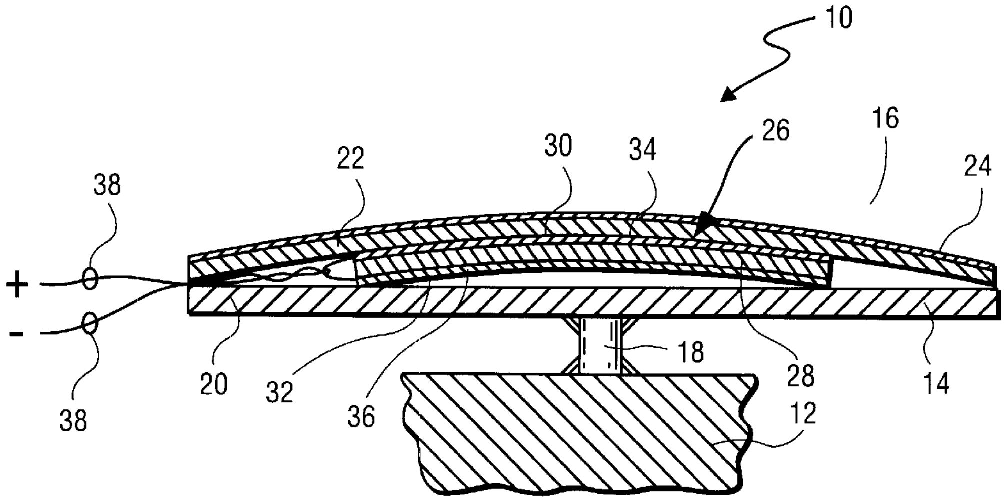
FIG. 1 is a cross-sectional side view of one embodiment of a pie electric speaker of the present invention.

Referring now to FIG. 1, a first embodiment of the piezoelectric speaker 10 is shown. The piezoelectric speaker comprises an elastic base 12, a case 14, a bender 16 disposed within the case and an acoustical linkage mechanism 18 mounted to both the elastic base 12 and the case 14 and serving to preferably rigidly interconnect the elastic base and the case. The bender 16 may be referred to as a piezodriver.

The case 14 further comprises a base portion 20 and a top portion 22. The base portion 20 is preferably fabricated from punchboard or other acoustically sound material. The top portion 22 may be fabricated from cardboard stock or other flexible, inexpensive material. The case 14 may further include an encapsulating layer 24 on the top portion 22. An encapsulated piezowafer creates stress waves as a reaction to an electrical voltage potential input and transmits acoustic waves through the entire structure surface into air. The encapsulation also provides durability, sustainability to harsh shock and protection from environmental conditions.

Figure 3:
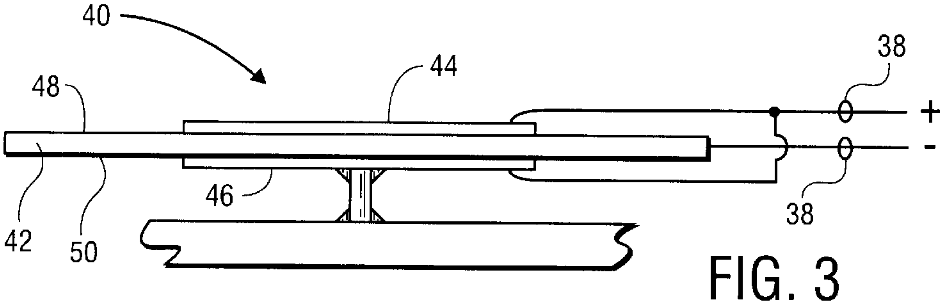
FIG. 3 is a side view of the bimorph bender of the piezoelectric speakers of the present invention with a schematic view of electrical connections.

The bender 16 preferably utilizes an electroactive wafer 26 or piezowafer and may comprise several different structures. One option is a unimorph piezoelectric structure that includes a piezoelectric material wafer bonded to a stiff member known in the art as a shim. A second alternative is a bimorph piezoelectric structure. The bimorph structure may include either two piezoelectric wafers bonded together or two piezoelectric wafers having a stiff shim bonded between the two wafers, as best shown in FIG. 3. It should be noted that the piezoelectric material wafers may be replaced by any type of electroactive material that responds to an electric field by developing a strain. A third alternative for the bender 16 is a RAINBOW® wafer.

The piezoelectric speaker embodiment shown in FIG. 1 utilizes a RAINBOW® wafer 28 having a dome structure. The wafer 28 defines a first surface 30 and a second surface 32. The first surface 30 carries a first electrode 34 and the second surface 32 carries a second electrode 36. Electric leads 38 are attached to the electrodes.

The vibrational mechanical energy of the piezodriver bender 16 is propagated through the acoustical linkage 18 into the elastic base 12. An optimal effect is created when the mechanical impedance of an attached structure is matched with a piezodriver impedance. The acoustical linkage 18 features a one point rigid attachment. For the embodiment shown in FIG. 1, this location is the center of the case 14. In the embodiment shown in FIG. 3, the acoustical linkage 18 should be attached to the center of the bender 16. This feature provides simplicity, compactness and low cost for the design.

The acoustical linkage 18 is preferably comprised of a rigid material such as a metal rod and is attached to a center portion of the case or bender by an adhesive or other securing means. In the embodiment shown in FIG. 1, the acoustical linkage 18 is attached to the center of the case 14. However, if a case is not used, the acoustical linkage 18 is attached to the bender 16, as best shown in FIGS. 2 and 3.

Figure 2:
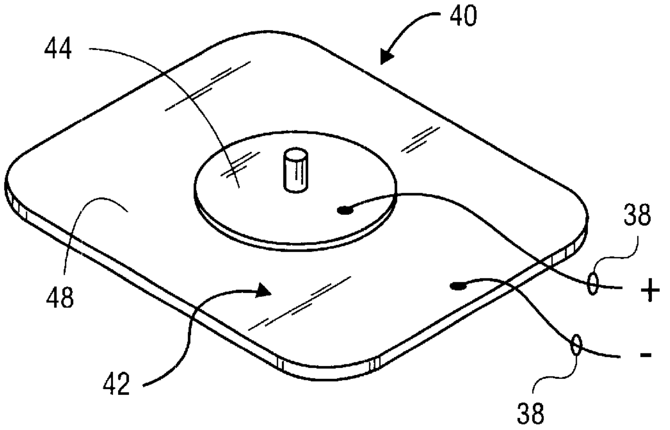
FIG. 2 is a perspective view of a bimorph bender of the piezoelectric speaker of the present invention.

Referring now to FIGS. 2 and 3, a bimorph embodiment 40 of the present invention is shown. In this embodiment, the bender includes a shim 42, a first piezoelectric material wafer 44 and a second piezoelectric material wafer 46. The shim defines a first surface 48 and a second surface 50. The first piezoelectric material wafer is bonded to the first surface of the shim and the second piezoelectric material wafer is bonded to the second surface of the shim. The shim 42 is preferably fabricated from a steel, brass or related material. The leads 38 connect the piezoelectric material wafers to an electrical audio signal. For better acoustical fidelity, leads should be soldered in close proximity to the center of the wafer and/or the shim. Alternatively, in a unimorph embodiment (not shown) a first piezoelectric material wafer is bonded to a first surface of a shim. In both the unimorph and bimorph embodiments, the piezoelectric material wafer is bonded to the shim such that the surface of the shim is in electrical contact with the electrodes of the piezoelectric material wafer. The acoustical linkage 18 may be secured to the wafer or the shim.

Figure 4:
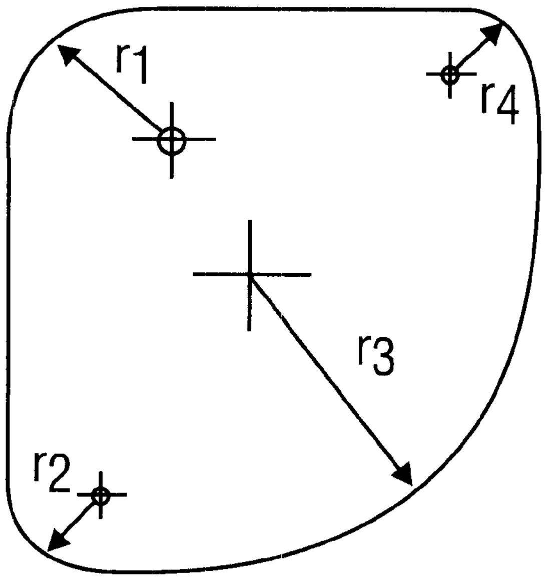
FIG. 4 is a top view of an alternative embodiment of the shim.

The shim 42 may be configured in any shape. Normal disk shaped benders have a narrow frequency response due to their high symmetry. A maximal breaking of this symmetry is needed to extend the range of response. Referring now to FIG. 4, for better acoustical fidelity, the geometry of the shim is optimized such that the shim contour has variable radii of curvature ($r_1$, $r_{,2}$, $r_3$, $r_{4,}$) with no sharp corners. Although the FIG. 4 shows four round corners, any number of such corners could be employed without departing from the teachings of this invention.

Figure 5:
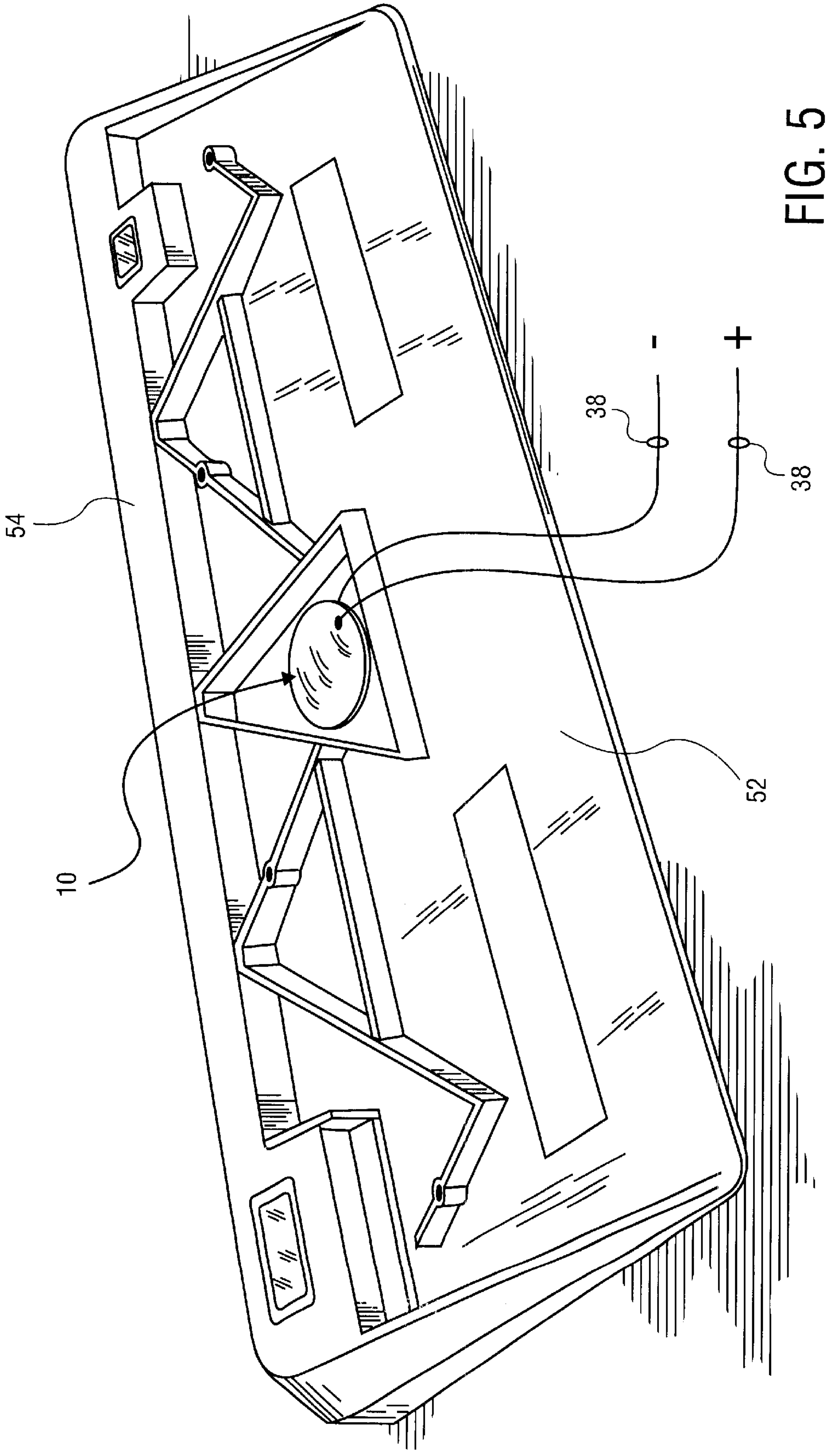
FIG. 5 is a perspective view of the piezoelectric speaker of the present invention in a computer keyboard application.

Referring now to FIG. 5, the piezoelectric speaker is shown utilizing a computer keyboard 52 as the elastic base. The piezoelectric speaker 10 is preferably attached to a plastic housing 54 of the computer keyboard, where space is available. An acoustical linkage 18 is used to attach the piezoelectric speaker 10 to the molded keyboard housing 54, in the manner depicted in FIG. 3. The electrical leads 38 are connected to an electrical audio source.

Figure 6:
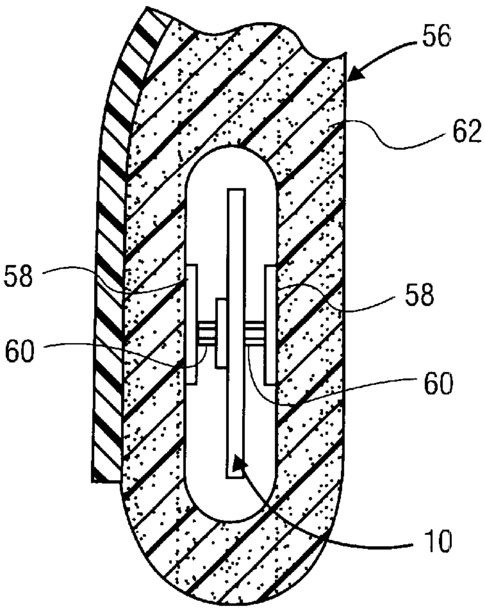
FIG. 6 is a cross-sectional view of the piezoelectric speaker of the present invention in an embodiment of a bicycle helmet application.
Figure 7:
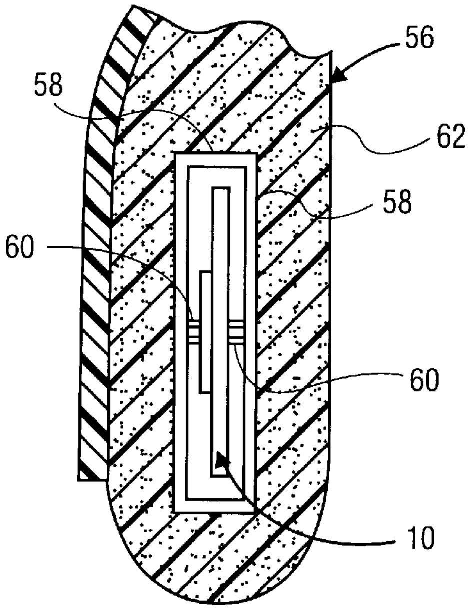
FIG. 7 is a cross-sectional view of the piezoelectric speaker of the present invention in another alternative embodiment of a bicycle helmet application.

Referring now to FIGS. 6 and 7, a piezoelectric speaker utilizing a bicycle helmet 56 as the elastic base is shown. As shown in FIG. 6, the bender 16 is attached by two connecting plates 58 made out of any rigid material such as hard plastic or sheet metal. Two fasteners 60 in conjunction with the connecting plates 58 function as the acoustical linkages to the foam structure. Connecting plates 58 may be augmented as shown in FIG. 7 to form an enclosure for the piezo bender 16. An advantage of this embodiment of the piezoelectric speaker is that the entire package may be molded into a foam layer 62 within the bicycle helmet 56.

Figure 8:
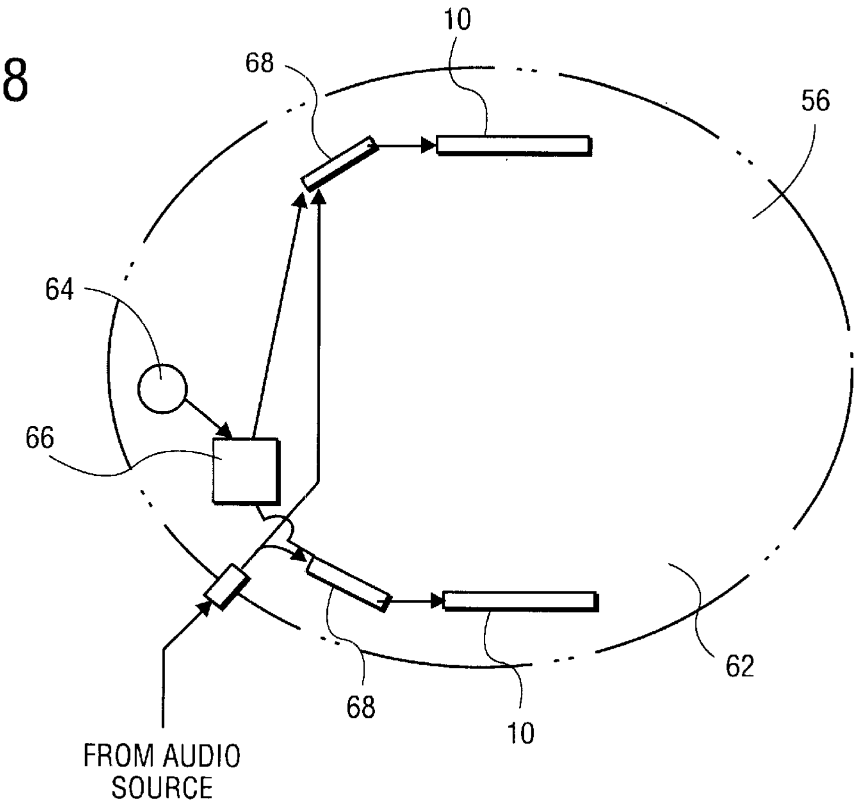
FIG. 8 is a top view of the piezoelectric speaker of the present invention in the bicycle helmet application.
Figure 9:
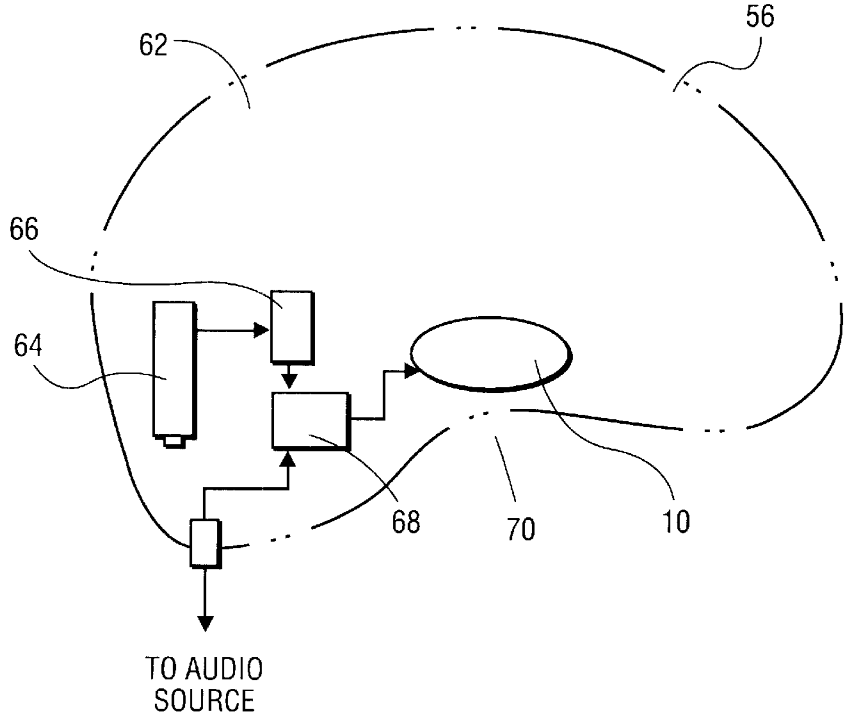
FIG. 9 is a side view of the piezoelectric speaker of the present invention in the bicycle helmet application.

The packaging of the piezoelectric speaker components within the foam layer of the bicycle helmet is shown in FIGS. 8 and 9. FIG. 8 demonstrates how an entire circuit is molded into the foam lining 62. A battery 68, a DC/DC converter 66, and voltage amplifiers 68 are molded into the foam and two speakers 10 for stereo sound are built into the helmet above a bicyclist's ears 70. Any source of audio signal can be connected to the jack 69. By not obstructing the bicycle's ears, this arrangement provides safe and convenient stereo sound.

Referring now to FIG. 10, an embodiment of the piezoelectric speaker 10 is shown wherein the elastic base is a conventional loudspeaker cone 72. The cone is attached to the bender 16 through an intermediate plate 74 and an acoustical linkage 76. The plate 74 may be fabricated from punchboard or other acoustically sound material.

Referring now to FIG. 11, an embodiment of the piezoelectric speaker is shown wherein the elastic base is an office desk 78. The speaker 10 is secured to the underside of a top surface 80 of the desk 78, such that the entire top surface 80 of the desk functions as a speaker.

Figure 12:
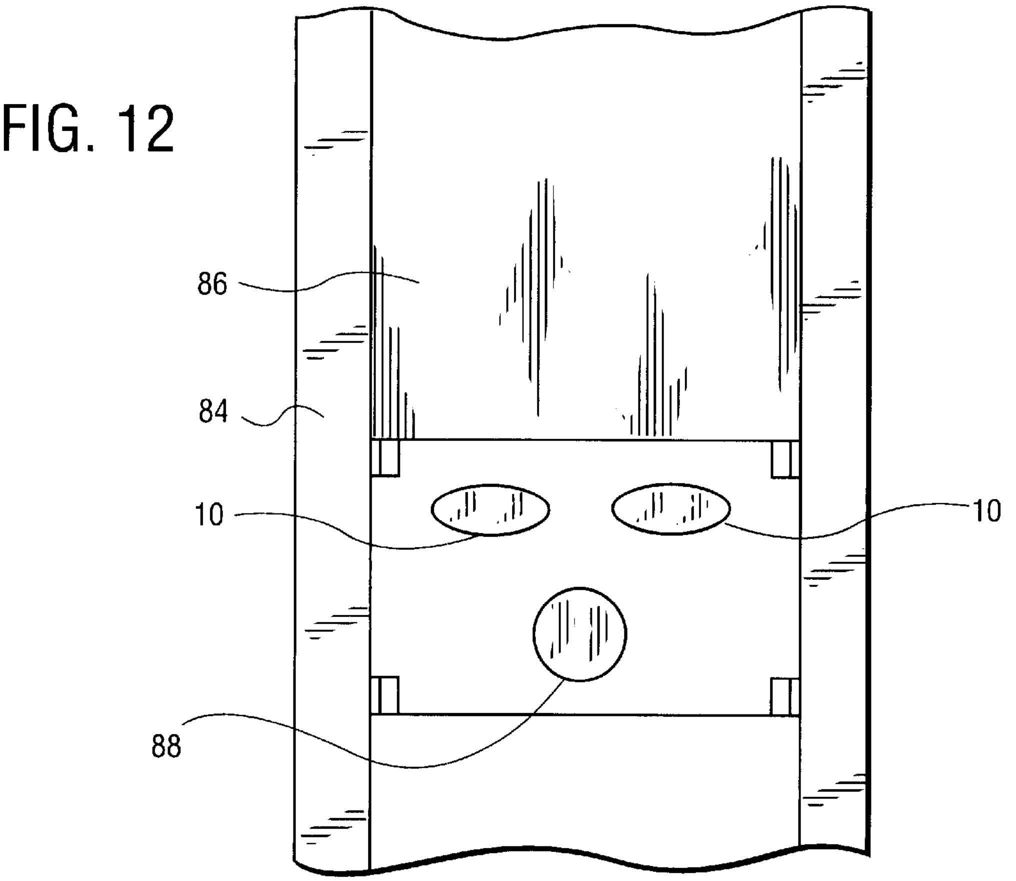
FIG. 12 is a front view of the piezoelectric speaker of the present invention in a building frame and drywall application.
Figure 13:
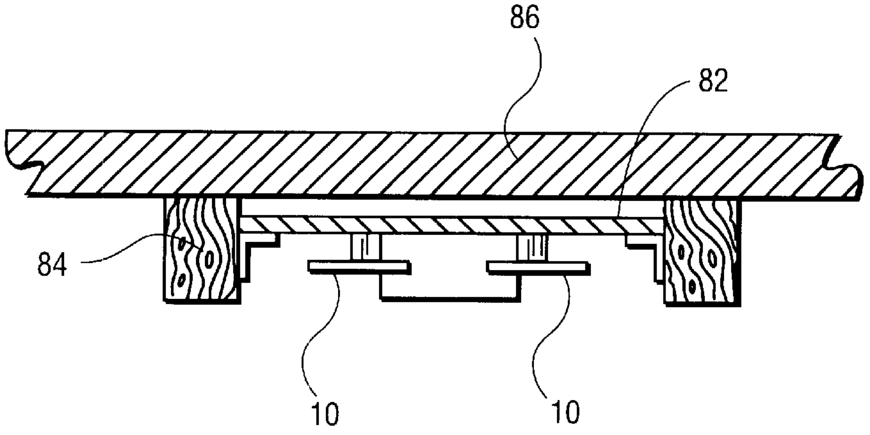
FIG. 13 is a side view of the piezoelectric speaker of FIG. 12.

Referring now to FIGS. 12 and 13, an embodiment of the piezoelectric speaker 10 is shown wherein the elastic base is plywood 82 linked through wall studs 84 to drywall material 86. This embodiment allows the present invention to be used as a home entertainment system. The speakers may be used for music or paging purposes.

A feature of embodiment shown in FIGS. 12 and 13 is the use of a third speaker 88 and the utilization of a tuned circuit with the piezoelectric speakers 10. The tuned circuit allows accentuation of any desired frequency from the piezoelectric speaker by combining two, three or four speakers. As a result, higher fidelity sound can be obtained.

Figure 14:
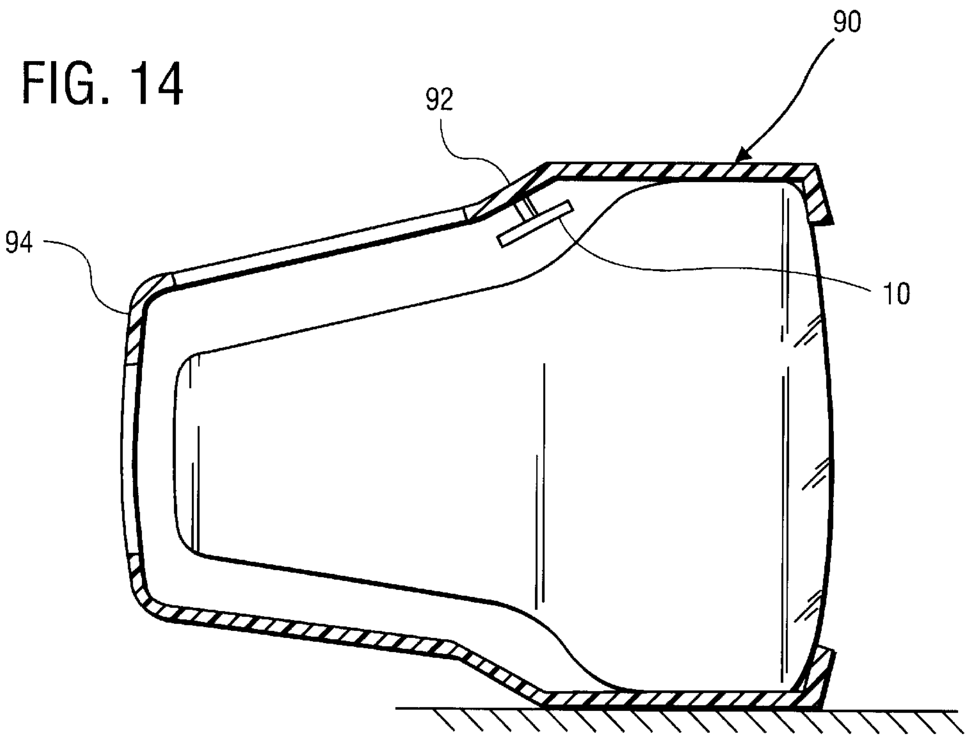
FIG. 14 is a side view of the piezoelectric speaker of the present invention in a computer monitor application.
Figure 15:
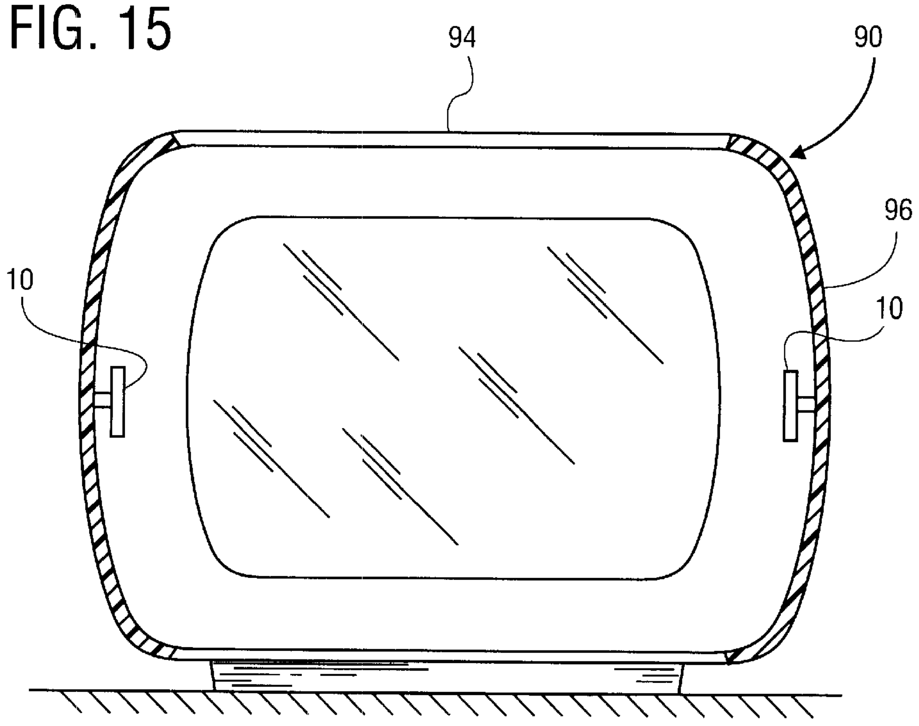
FIG. 15 is a front view of the piezoelectric speaker of the present invention in an alternative embodiment of a computer monitor application.
Figure 16:
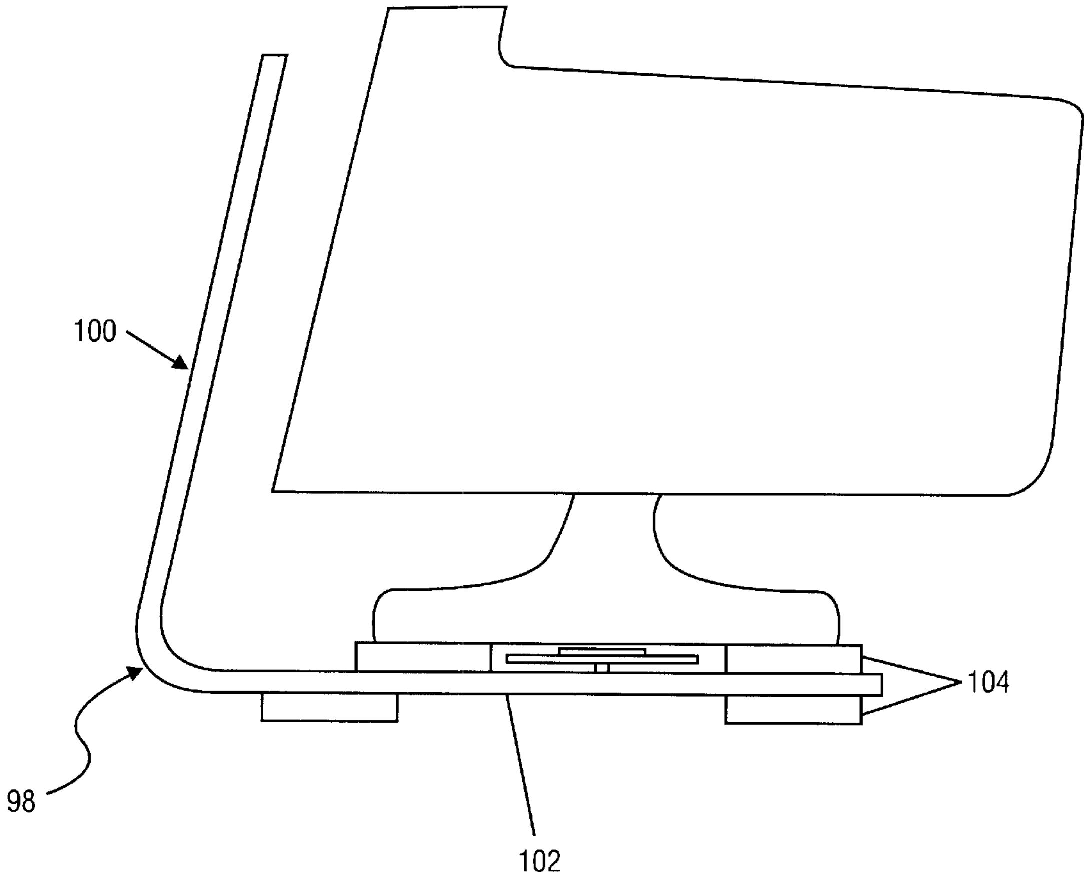
FIG. 16 is a side view of an alternate embodiment of the piezoelectric speaker of the present invention in a computer monitor application.

Referring now to FIGS. 14 and 15, an embodiment of the piezoelectric speaker is shown wherein the elastic base is a computer monitor 90. The piezoelectric speaker 10 is secured to an upper wall 90 of a plastic cabinet 94 of the computer monitor. Alternatively, the speaker may be secured to a sidewall 96 of the plastic cabinet 94 of the computer monitor 90. Yet another alternate embodiment of the piezoelectric speaker as applied to a computer monitor 90 is shown in FIG. 16, wherein the piezoelectric speaker 10 is secured to a transparent panel 98. The transparent panel 98 has a first portion 100 and a second portion 102. The first portion 100 of the panel 98 is placed under the computer monitor 90 and a piezoelectric speaker 10 is attached thereto. The second portion 102 of the panel is in perpendicular contact with the first portion 100, such that the second portion 102 extends parallel to the face of the computer monitor. Acoustic insulators 104 can be placed above and below the first portion 100 of the transparent panel 98 in order to maintain the acoustic fidelity of the piezoelectric speaker 10. The second portion 102 of the transparent panel 98 can also be a convenient platform for depositing anti-glare features. The transparent panel 98 can also be adapted to function as a hands-free speakerphone by installing the proper electronics to allow the piezoelectric speaker 10 to function as a microphone.

Figure 17:
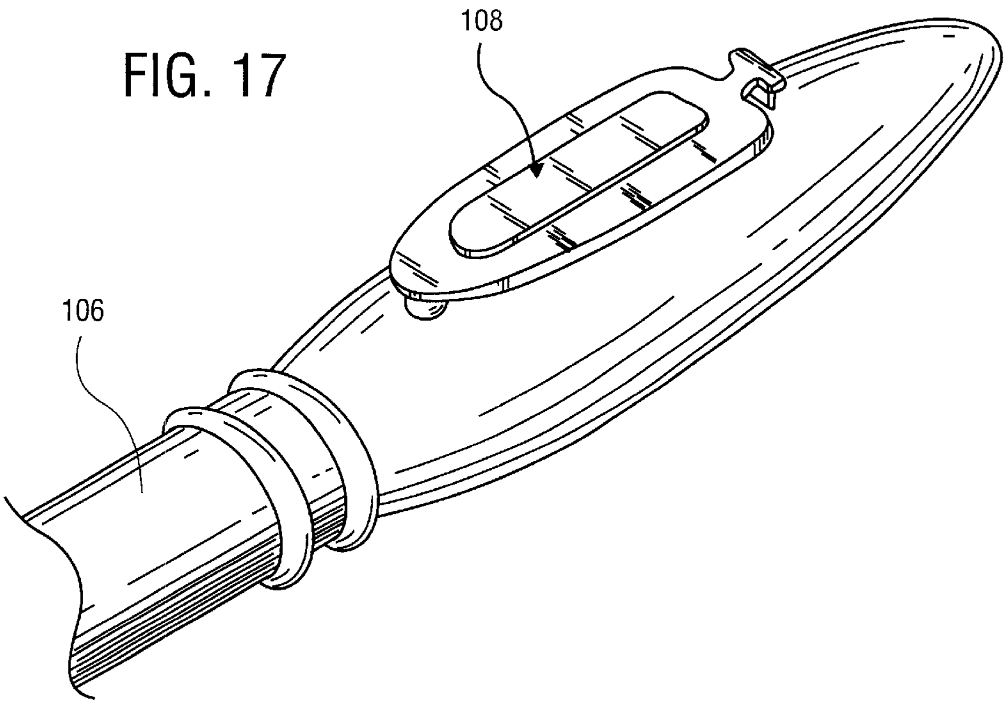
FIG. 17 is a perspective view of the piezoelectric speaker of the present invention in a pen application.
Figure 18:
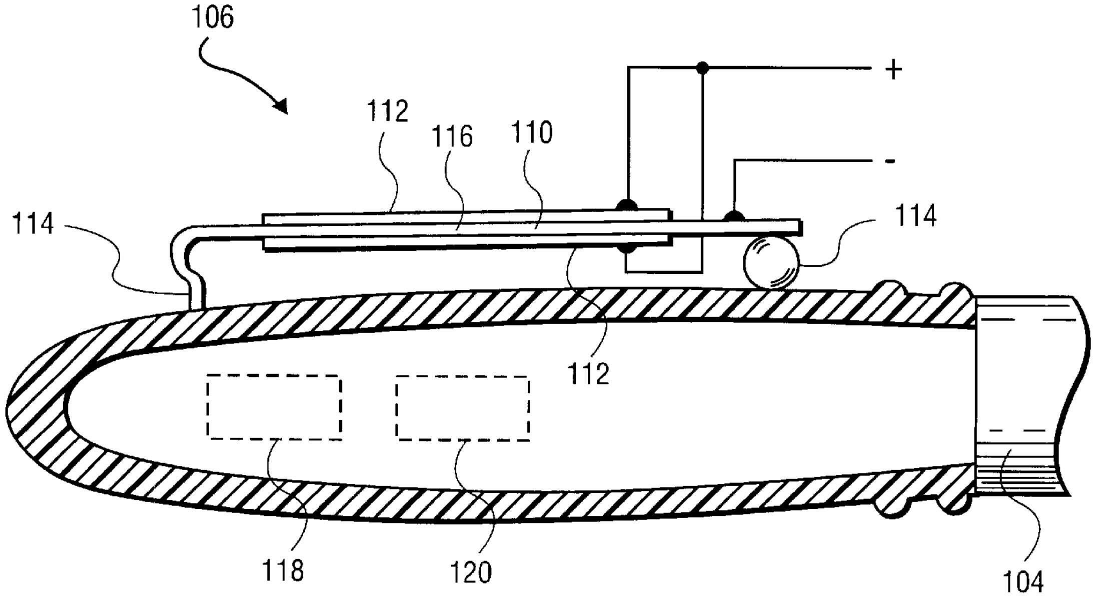
FIG. 18 is a cross-sectional side view of the piezoelectric speaker of FIG. 17.

Referring now to FIGS. 17 and 18, an embodiment of the piezoelectric speaker is shown wherein the elastic base is a pen or pencil 106. In this embodiment the speaker 10 is preferably integrated into a clip 108 of the pen or pencil. As shown in FIG. 18, the bender 16 may comprise a bimorph having a shim 110, two waters 112, and two acoustical linkage 114. The electrical leads are connected internally to an electrical source 118. A power supply 120 is also located within the pen or pencil 106.

Referring now to FIG. 19, a secondary winding 120 of transformer 122 is shown that can be tuned to a desired frequency by selecting inductance $L_2$ as a function of capacitance C of the piezoelectric speaker. By utilizing two to three piezospeakers tuned for low, mid and high range, one can build a high quality entertainment center with low cost and low power consumption. For better acoustical fidelity, the transformer turns ratio should be in the range of 5 to 7.

Figure 20:
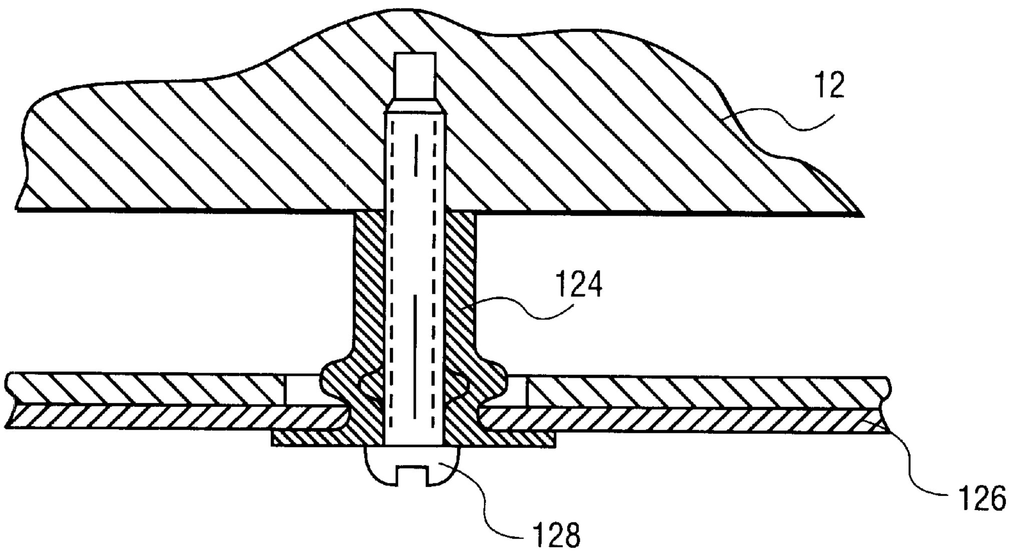
FIG. 20 is a side view of the piezoelectric speaker of the present invention depicting an alternative embodiment of the acoustical linkage.

Referring now to FIG. 20, an alternative embodiment of the piezoelectric speaker 10 is shown wherein the acoustical linkage 18 is a rivet-nut 124. The rivet-nut 124 is concentrically inserted through the center of the shim 126. A threaded screw 128 is used to secure the rivet-nut 124 to the elastic base 12. During the assembly process, the rivet-nut 124 is upset to capture the shim 126 securely in place.

In an alternate embodiment of the invention (not shown), two benders 16 are placed in a spaced apart relationship one on top of another and the benders 16 are rigidly attached to the elastic base 12 using a common acoustical linkage. This configuration increases the dB level sensitivity.

Figure 21:
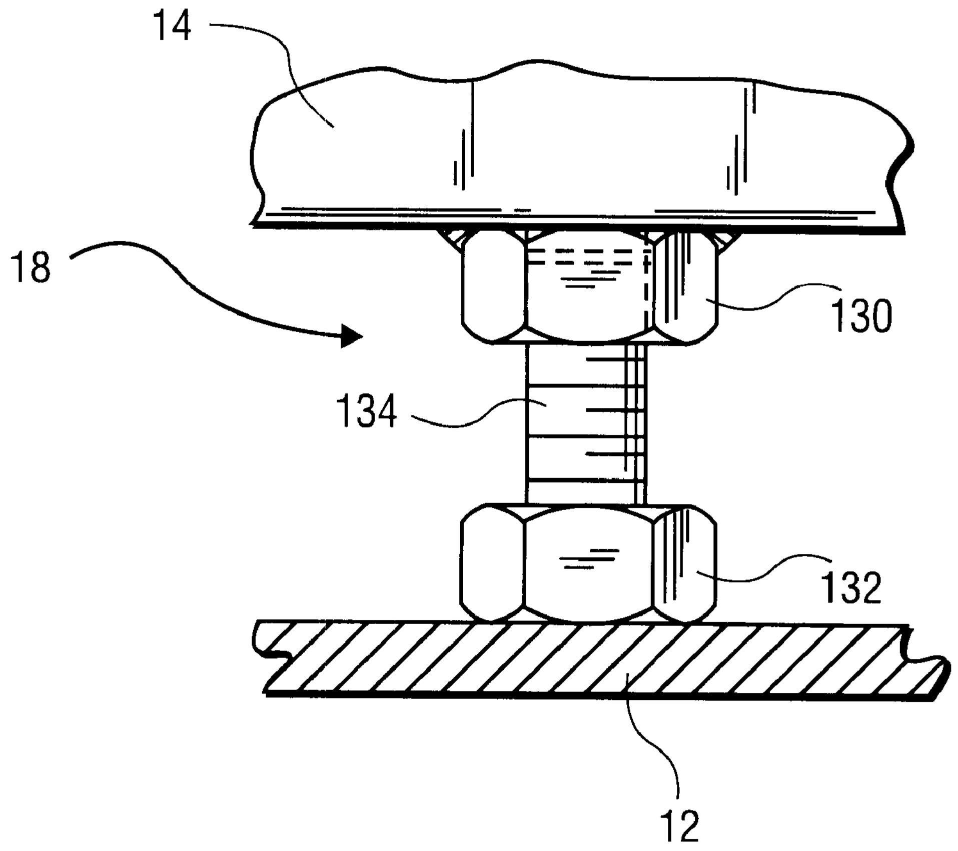
FIG. 21 is a side view of an alternative embodiment of an acoustical linkage of the piezoelectric speaker of the present invention.

Referring now to FIG. 21, an alternative embodiment of the acoustical linkage 18 is shown. In this embodiment, the acoustical linkage 18 is constructed of a first nut 130, secured to the case 14 and a second nut 132 secured to the elastic base 12. A bolt 134 serves to interconnect the two nuts 130, 132.

Figure 22:
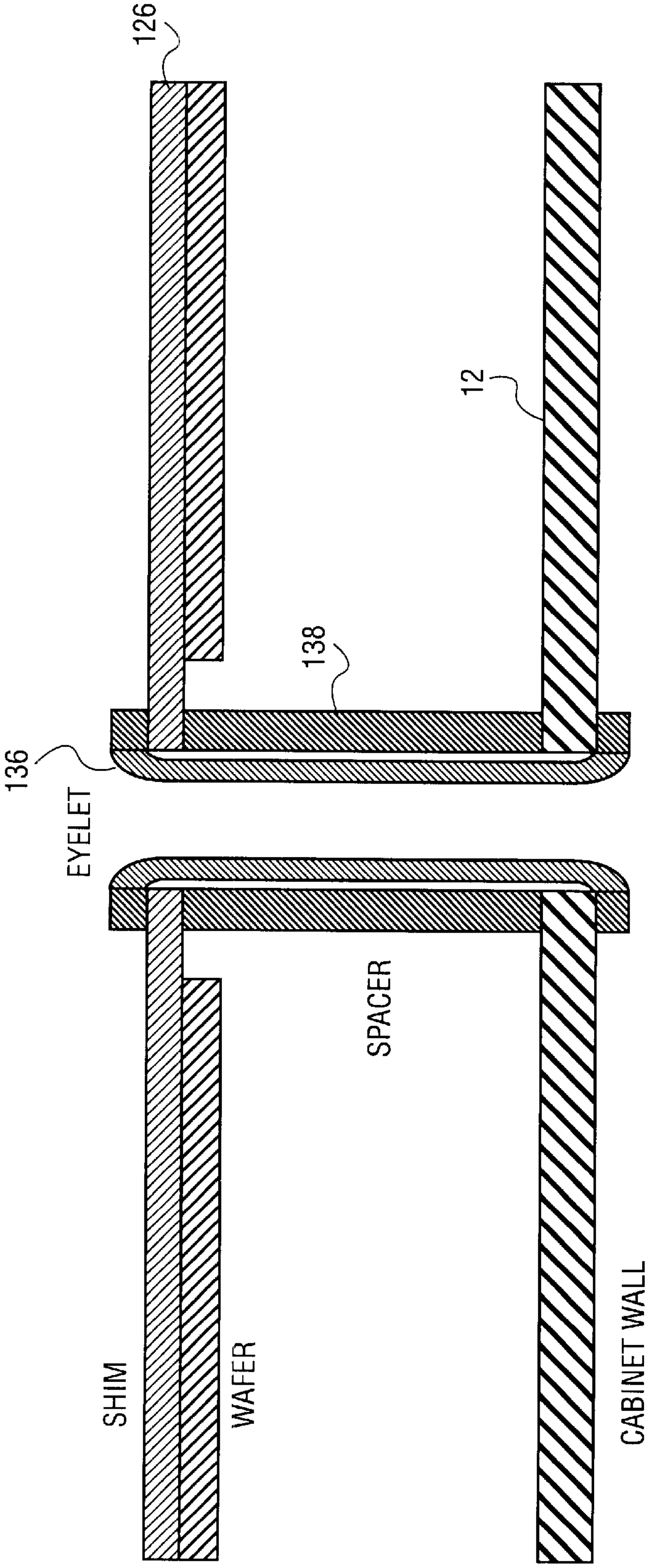
FIG. 22 is a side view of the piezoelectric speaker of the present invention depicting an alternative embodiment of the acoustical linkage.

Referring now to FIG. 22, an alternative embodiment of the piezoelectric speaker 10 is shown wherein the acoustical linkage 18 comprises an eyelet 136 and spacer 138 combination. The spacer 138 are placed between the bender 16 and the elastic base 12, preserving a fixed distance between them. The eyelet 136 engages the bender 16 and the elastic base 12 securing them in a fixed relationship.

Figure 23:
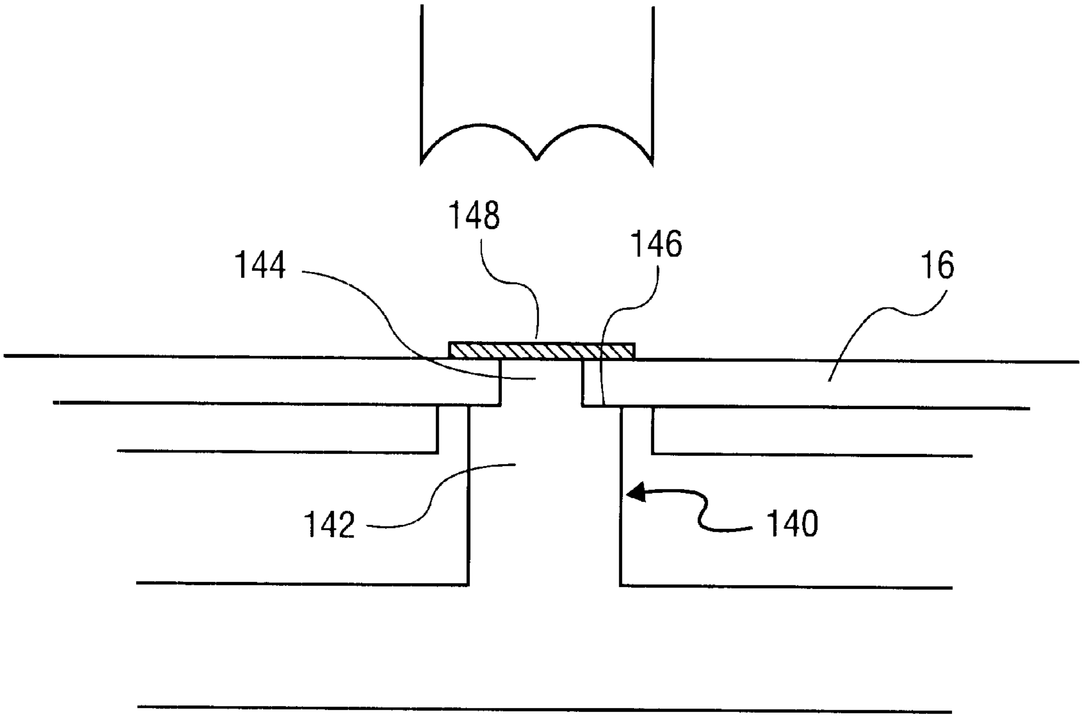
FIG. 23 is a side view of the piezoelectric speaker of the present invention depicting an alternative embodiment of the acoustical linkage.

Referring now to FIG. 23, yet another embodiment of the acoustical linkage is described. In this embodiment, the elastic base 12 comprises an integrally molded mounting stud 140. The mounting stud 140 has a first portion 142 and a second portion 144. The diameter of the first portion 142 of the mounting stud 140 is greater than the diameter of the second portion 144 of the mounting stud 140, thus forming a shoulder 146 thereon. The second portion 144 of the mounting stud 140 extends through the center of the bender 16. The head 148 of the second portion 144 is flattened to rigidly capture the bender 16 against the shoulder 146 of the mounting stud. The head 148 can be flattened by ultrasonic staking, heat staking or other flattening means.

Figure 24:
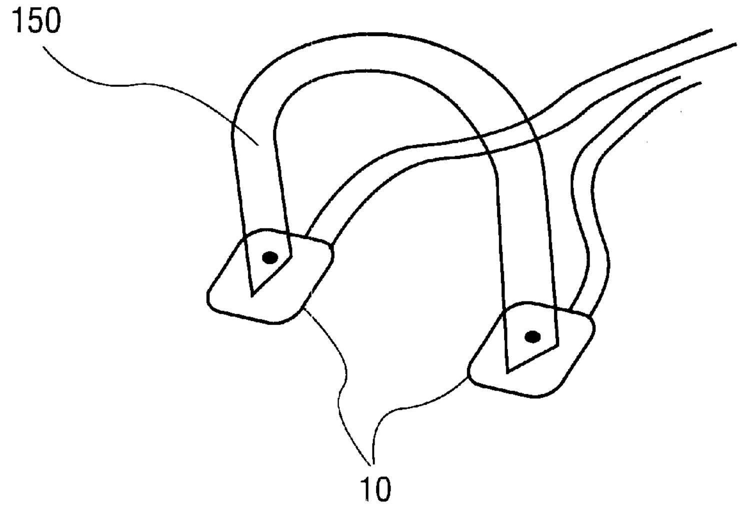
FIG. 24 is a perspective view of two piezoelectric speakers carried by a springed arch.
Figure 25:
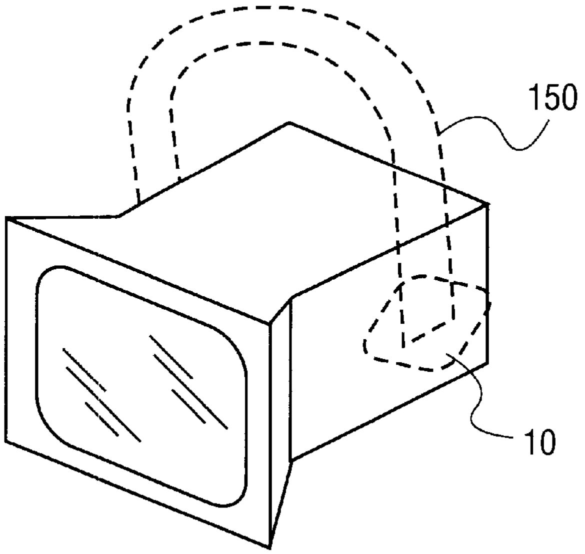
FIG. 25 is a perspective view of the piezoelectric speakers of FIG. 24 in a computer monitor application.

Referring now to FIG. 24, a modular means of attaching the piezo speaker 10 to an elastic base 12 is shown. A springed arch 150 is shown carrying a piezoelectric speaker 10 at each end of the arch 150. The springed arch 150 is preferably sized so that it will acquire a bending preload when installed around the intended structure. For example, FIG. 25 shows a springed arch 150 enclosing a computer monitor. The piezoelectric speakers 10 are held firmly against the outer panels of the structure, utilizing the structure as an elastic base 12.

Figure 26:
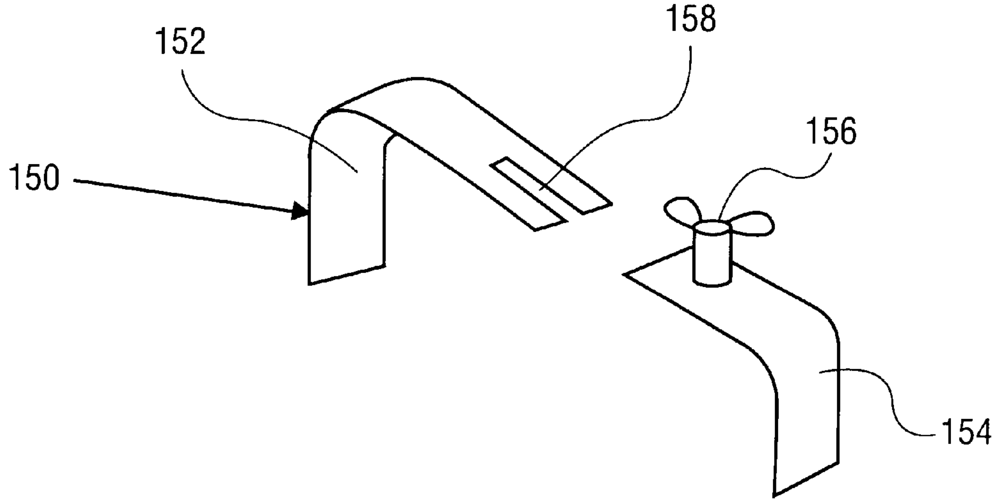
FIG. 26 is a perspective view of an adjustable fastener to be used in an alternative embodiment of the piezoelectric speakers shown in FIG. 24.

The springed arch 150 can be modified to allow for adjustments in size. As best seen in FIG. 20, the arch is divided into first portion 162 and second portion 154 connected by a repositionable fastening means. The fastening means depicted in FIG. 26 consists of a wingnut 156 and a slot 158. The wingnut 156 is slidably engaged with slot 158. Once the desired size is achieved, the wingnut 156 is tightened to secure the arch 150 in position, Other adjustable fastening means, such as hook-and-loop fasteners, velcro adhesives strips, and other fastening means can also be utilized without departing from the teachings of this invention.

This configuration advantageously permits the user to attach the speakers to any of several alternative structures just by readjusting the fastening means. This way, the speakers' utility is extended easily while the user's needs change.

There has been described hereinabove an exemplary preferred embodiment of the piezoelectric speaker according to the principles of the present invention. Those skilled in the art may now make numerous uses of, and departures from, the above-described embodiments without departing from the inventive concepts disclosed herein. Accordingly, the present invention is to be defined solely by the scope of the following claims.

We claim:

1. A piezoelectric speaker comprising:

an elastic base:

a bender interconnected to said elastic base, said bender comprising a shim and at least one piezoelectric material wafer bonded to said shim; and an elongated rigid acoustical linkage mounted to both said elastic base and said piezoelectric material wafer and serving to interconnect said elastic base and said bender, and wherein the elongated rigid acoustical linkage is a metal rod.

2. A piezoelectric speaker as claimed in claim 1 wherein said elongated rigid acoustical linkage is mounted to said piezoelectric material wafer at approximately the geometric center of the piezoelectric material wafer.

3. A piezoelectric speaker as claimed in claim 1 wherein said bender is a piezoelectric unimporph structure.

4. A piezoelectric speaker as claimed in claim 1 wherein said bender is a piezoelectric bimorph structure.

5. A piezoelectric speaker as claimed in claim 1 wherein said bender is arc-shaped.

6. A piezoelectric speaker in accordance with claim 1 wherein said shim has a contour with variable radii of curvature.

7. A piezoelectric speaker in accordance with claim 1 wherein said elastic base has elastic base mechanical impedance and said bender has a mechanical impedance and further wherein said elastic base mechanical impedance matches said bender mechanical impedance.

8. A piezoelectric speaker in accordance with claim 1 wherein said elastic base is comprised of a computer keyboard.

9. A piezoelectric speaker in accordance with claim 1 wherein said elastic base is comprised of a desk.

10. A piezoelectric speaker in accordance with claim 1 wherein said elastic base is comprised of a plastic shell of a computer monitor.

11. A piezoelectric speaker in accordance with claim 1 wherein said elastic base is comprised of plywood.

12. A piezoelectric speaker in accordance with claim 1 wherein said elastic base is comprised of a bicycle helmet.

13. A piezoelectric speaker in accordance with claim 1 wherein said elastic base is comprised of a pen.

14. A piezoelectric speaker in accordance with claim 1 wherein said elongated rigid acoustical linkage comprises:

a rivet-nut concentrically inserted through the center of said bender; and a threaded screw securing said rivet-nut to said elastic base.

* * * * *